(12) United States Patent
Siebert

(10) Patent No.: US 7,786,476 B2
(45) Date of Patent: Aug. 31, 2010

(54) SEMICONDUCTOR DEVICE SYSTEM AND METHOD FOR MODIFYING A SEMICONDUCTOR DEVICE

(75) Inventor: Harry Siebert, Puchheim (DE)

(73) Assignee: Infineon Technologies AG, Neubiberg (DE)

( * ) Notice: Subject to any disclaimer, the term of this patent is extended or adjusted under 35 U.S.C. 154(b) by 188 days.

(21) Appl. No.: 11/734,068

(22) Filed: Apr. 11, 2007

(65) Prior Publication Data
US 2007/0249068 A1     Oct. 25, 2007

(30) Foreign Application Priority Data
Apr. 11, 2006     (DE) ................. 10 2006 017 059

(51) Int. Cl.
*H01L 23/58* (2006.01)
(52) U.S. Cl. ................... 257/48; 438/15; 257/E25.014
(58) Field of Classification Search ............... 438/15, 438/109; 257/777, 48, E25.014
See application file for complete search history.

(56) References Cited

U.S. PATENT DOCUMENTS

| 6,133,629 | A | 10/2000 | Han et al. |
| 6,301,121 | B1 | 10/2001 | Lin |
| 6,369,448 | B1 * | 4/2002 | McCormick ................ 257/777 |
| 6,916,682 | B2 | 7/2005 | Gerber et al. |

* cited by examiner

*Primary Examiner*—David A Zarneke
*Assistant Examiner*—Jenny L Wagner
(74) *Attorney, Agent, or Firm*—Dicke, Billig & Czaja, PLLC

(57) ABSTRACT

A semiconductor device system and a method for modifying a semiconductor device is disclosed. In one embodiment, a function provided by a circuit positioned on the semiconductor device is replaced, modified, and/or supplemented by a function provided by a circuit positioned on a further semiconductor device.

7 Claims, 3 Drawing Sheets

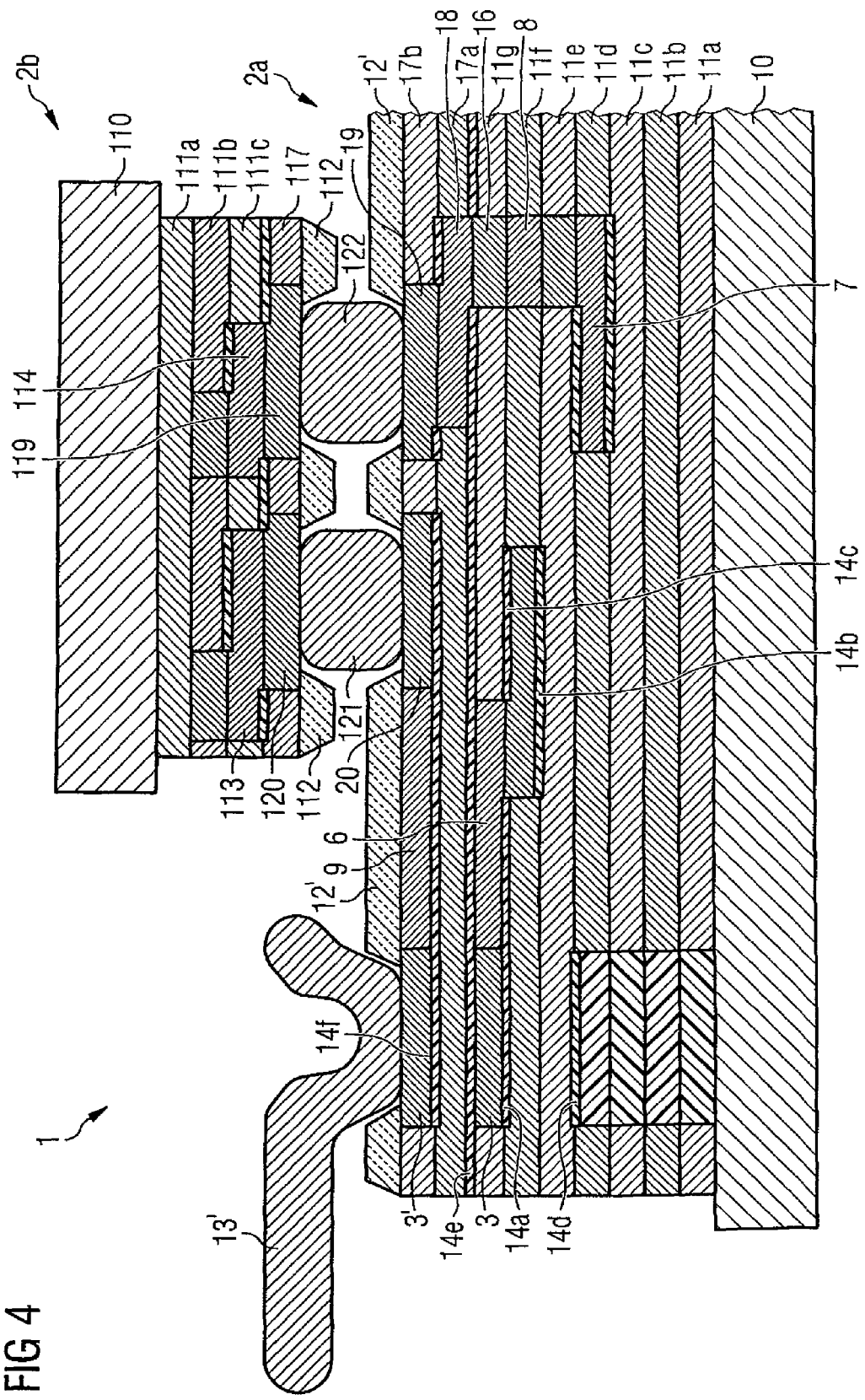

SEMICONDUCTOR DEVICE SYSTEM AND METHOD FOR MODIFYING A SEMICONDUCTOR DEVICE

CROSS-REFERENCE TO RELATED APPLICATIONS

This Utility Patent Application claims priority to German Patent Application No. DE 10 2006 017 059.8 filed on Apr. 11, 2006, which is incorporated herein by reference.

BACKGROUND

The invention relates to a semiconductor device system and to a method for modifying a semiconductor device.

Semiconductor devices, e.g., corresponding, integrated (analog or digital) computing circuits, semiconductor memory devices such as functional memory devices (PLAs, PALs, etc.) and table memory devices (e.g., ROMs or RAMs, in particular SRAMs and DRAMs), etc. are adapted to be incorporated in a corresponding package, e.g., a plug or surface-mountable package, e.g., a BGA (Ball Grid Array) package, etc. after manufacturing.

In so doing, connections, e.g., pads, provided at the semiconductor device are, by using bonding wires, connected with connections—pins—provided at the semiconductor package.

Contrary to this, so called "flip" semiconductor devices or "flip chips" are mounted directly—without separate bonding wires.

In the case of flip chips one can, for instance, differentiate between FCIP—(Flip Chip in Package) and FCOB (Flip Chip on Board) devices.

FCOB devices are devices without package in which corresponding device connections are directly connected with corresponding connections provided at a circuit board.

Contrary to this, in the case of FCIP devices, corresponding connections provided at the device are (directly, without bonding wire) connected with corresponding connections of a FCIP device package.

The name "flip chip" is derived from the fact that, with this construction, a corresponding device is mounted with its functional side upside down on the circuit board/in the device package, etc.

The connection between the device connections—e.g., corresponding "bumps" provided at the device, or corresponding contact faces, etc.—and the connections at the circuit board/the device package, etc. may, for instance, be provided by appropriate reflow soldering and/or appropriate gluing processes.

In the case of reflow soldering, solder is applied on the device connections. Subsequently, the device can be fixed with glue, and then the solder can be melted by heating.

By using the flip chip construction, it is possible to achieve relatively high package densities.

In a single device package—instead of one single semiconductor device—a plurality of, e.g., two or three devices, may alternatively also be arranged. Thus, it is possible to (even further) increase the package density.

In the case of "micro flip chip" devices, for instance, a corresponding first semiconductor device—having, for instance, relatively small dimensions—(and possibly one or a plurality of further semiconductor devices) are mounted with the functional side upside down on a second semiconductor device—having, for instance, larger dimensions than the first semiconductor device.

In so doing, connections (e.g., corresponding bumps and/or contact faces) provided at the first semiconductor device are directly—without bonding wire—connected with corresponding connections of the second semiconductor device.

The first and second semiconductor devices may be jointly mounted in a plug or surface-mountable package, e.g., a BGA (Ball Grid Array) package, etc.

Connections (pads) provided at the second semiconductor device may, by using bonding wires, be connected with connections (pins) provided at the device package, so that corresponding signals can be input in the second semiconductor device or can be output from the second semiconductor device, respectively, via the pins.

For the input or output of signals in or from the first semiconductor device—that is mounted upside down on the second semiconductor device—, one or a plurality of further, additional pads may be provided at the second semiconductor device.

The additional pads may, via corresponding lines provided in the second semiconductor device, be connected with the connections of the second semiconductor device which are—without bonding wire—connected with the above-mentioned bumps/contact faces of the first semiconductor device.

The additional pads of the second semiconductor device may, by using bonding wires, be connected with pins provided at the device package, so that corresponding signals can—via the additional pads, the lines provided in the second semiconductor device, and the bumps/contact faces of the first semiconductor device connected therewith—be transmitted to the first semiconductor device (or vice versa signals output by the first semiconductor device can—via the lines that are connected with corresponding bumps/contact faces of the first semiconductor device and that are provided in the second semiconductor device—be transmitted to the additional pads, and from there to the pins of the device package).

However, the additional pads provided at the second semiconductor device absorb a relatively large chip space.

With conventional semiconductor devices—e.g., corresponding devices incorporated in a plug or surface-mountable package, e.g., a BGA (Ball Grid Array) package, etc.—it is i.e. a disadvantage that the corresponding semiconductor device has to be completely redesigned in the case of new or modified and/or supplemented demands posed to a semiconductor device (and possibly also with an initially faulty design).

This is relatively time-consuming and entails relatively high costs.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a schematic detailed sectional view of a section of the device system in the second state illustrated in FIG. 2.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor device system and a method for modifying a semiconductor device by which the above-mentioned and/or further disadvantages of conventional devices or methods can be overcome at least partially.

One embodiment provides a method for modifying a semiconductor device, wherein a function provided by a circuit positioned on the semiconductor device is replaced, modified, and/or supplemented by a function provided by a circuit positioned on a further semiconductor device, in particular a micro flip chip semiconductor device.

After the modification of the semiconductor device, a pad may be used for the input and/or output of signals which is positioned perpendicularly above a pad used for the input and/or output of signals prior to the modification of the semiconductor device (i.e. at a corresponding place as the pad used for the input and/or output of signals prior to the modification of the semiconductor device).

Another embodiment provides a semiconductor device system including a semiconductor device and a further semiconductor device, in particular a micro flip chip semiconductor device, wherein a function provided by a circuit positioned on the semiconductor device is replaced, modified, and/or supplemented by a function provided by a circuit positioned on the further semiconductor device.

In one embodiment, the circuit positioned on the further semiconductor device, in particular micro flip chip semiconductor device, is connected with a pad that is positioned perpendicularly above a pad with which the circuit positioned on the semiconductor device is connected (i.e. at a corresponding place as the pad with which the circuit positioned on the semiconductor device is connected).

Figure 1:
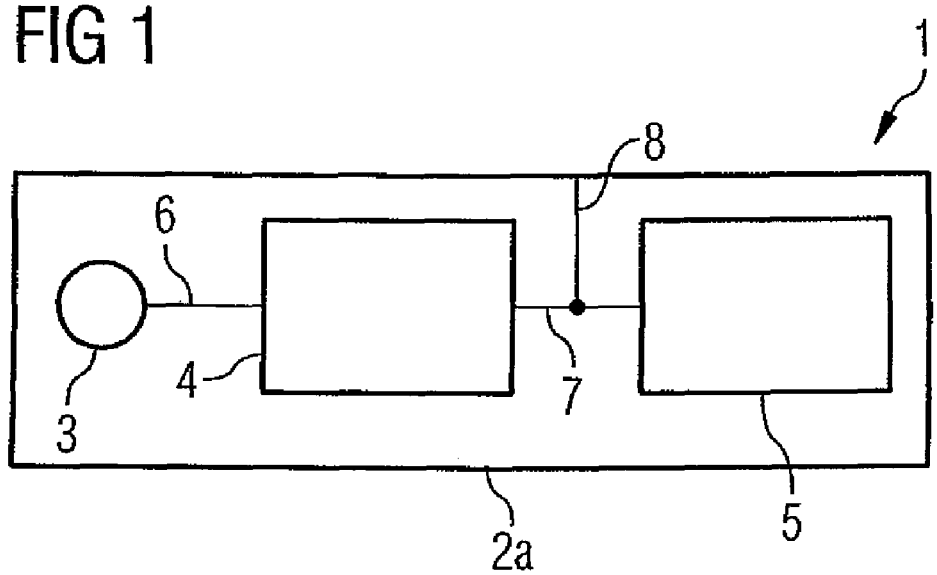
FIG. 1 illustrates a schematic representation of a device system in a first state.

FIG. 1 illustrates a schematic representation of a device system 1.

The device system 1 includes a semiconductor device 2a (here: a base chip).

The semiconductor device 2a may be any integrated (analog or digital) circuit, e.g., a microprocessor or microcontroller, and/or a semiconductor memory device such as a functional memory device (PLA, PAL, etc.) or a table memory device (e.g., ROM or RAM, in particular SRAM or DRAM), etc.

The semiconductor device 2a is incorporated in a corresponding package, e.g., a plug or surface-mountable package, e.g., a BGA (Ball Grid Array) package, etc.

As is schematically illustrated in FIG. 1, the semiconductor device 2a has a plurality of connections, pads 3, at the surface thereof.

The pads 3 are, by using bonding wires, connected to connections, pins, provided at the device package.

For producing the bond wire connections between the pads 3 and the corresponding pins, an appropriate conventional bonding machine may be used.

The pads 3 or pins may, on principle, be any (payload) data, address, and/or control pads or pins.

Via the pins, the bonding wires that are connected therewith, and the pads 3 that are connected to the bonding wires, corresponding (payload) data, address, and/or control signals can thus be input in the semiconductor device 2a, or corresponding (payload) data, address, and/or control signals can be output from the semiconductor device 2a via the pads 3, the bonding wires that are connected therewith, and the pins that are connected to the bonding wires, respectively.

As results from FIG. 1, the semiconductor device 2a comprises a plurality of interconnected and interacting circuit blocks 4, 5 providing respective specific functions, e.g., one or a plurality of peripheral circuit blocks 4, and one or a plurality of further circuit blocks 5—providing, for instance, the actual core function or functions, respectively, of the semiconductor device 2a—, etc.

The peripheral circuit block(s) 4 may, for instance, comprise corresponding receiver circuits, and/or corresponding driver circuits, and/or corresponding flip flops—acting as buffers—, and/or a plurality of further circuit elements, etc.

The signals ((payload) data, address, and/or control signals) input at the pins or pads 3 are, via one or a plurality of signal lines 6 provided in the semiconductor device 2a, transmitted to the peripheral circuit block(s) 4, are processed correspondingly there, and the processed signals are, via one or a plurality of further signal lines 7 provided in the semiconductor device 2a, transmitted to the further circuit block(s) 5.

Signals ((payload) data, address, and/or control signals) output by the further circuit block(s) 5 may, via the above-mentioned and/or one or a plurality of further signal lines 7 provided in the semiconductor device 2a, be transmitted to the peripheral circuit block(s) 4, be processed correspondingly there, and the processed signals may, via the above-mentioned and/or one or a plurality of further signal lines 6 provided in the semiconductor device 2a, be transmitted to the pad(s) 3, and from there, via the corresponding bonding wire(s), to the pin(s) connected therewith.

If a new or modified and/or supplemented function is to be provided by the semiconductor device 2a, and/or a function that is, as compared to an initially faulty function, then faultless, etc. (in particular a function that is new or modified and/or supplemented and/or faultless vis-à-vis the function provided by the circuit block(s) 4), a further semiconductor device 2b—assuming the function of the circuit block(s) 4—will be used, as will be explained in more detail in the following and as is schematically illustrated in FIG. 2 (or alternatively, instead of the further semiconductor device 2b illustrated in FIG. 2, a plurality of further semiconductor devices).

The further semiconductor device 2b may be a micro flip chip semiconductor device having, for instance, relative small dimensions, which is, even prior to the incorporation of the semiconductor devices 2a, 2b in a corresponding package, mounted with its functional side upside down on the upper side of the semiconductor device 2a having, for instance, larger dimensions than the further semiconductor device 2b.

In so doing, connections (e.g., corresponding bumps and/or contact faces, e.g., corresponding flip pads) provided at the further semiconductor device 2b are directly—without bonding wire—connected with corresponding connections (e.g., corresponding flip pads) provided at the upper side of the semiconductor device 2a.

Figure 2:
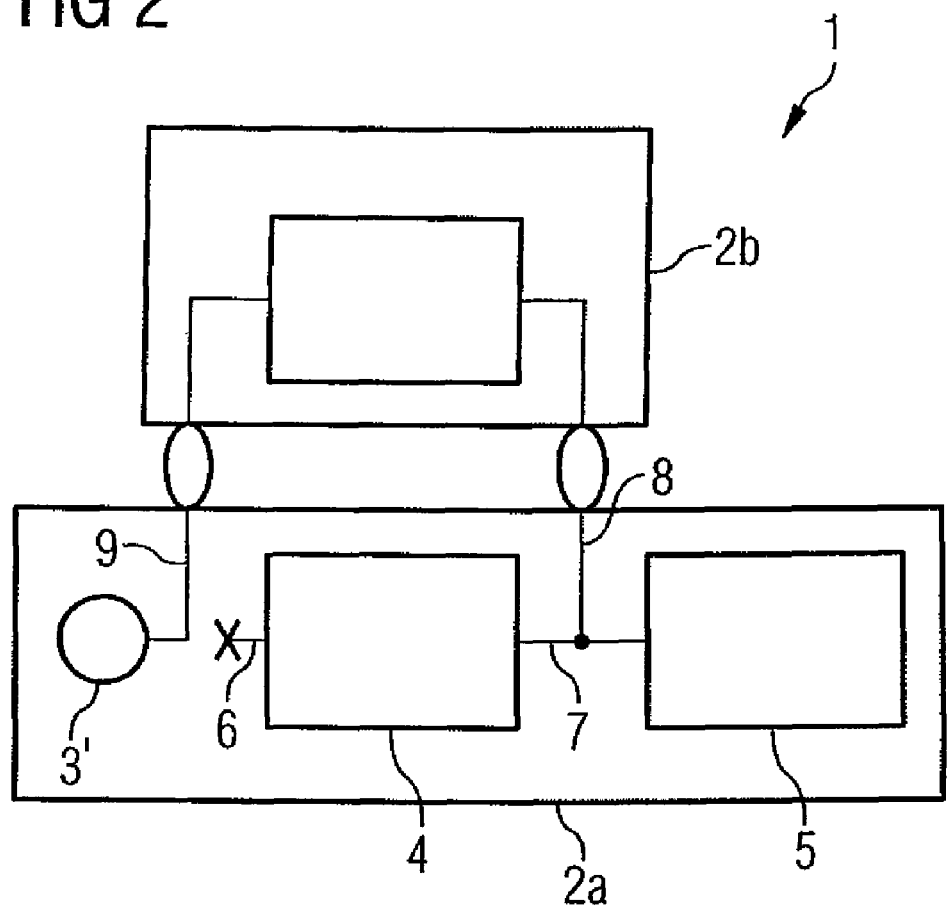
FIG. 2 illustrates a schematic representation of the device system in a second state.

As results from FIG. 1 and FIG. 2, the (further) circuit block (s) 5 provided in the semiconductor device 2a are connected, via the above-mentioned signal line(s) 7—except to the circuit block(s) 4—additionally, via one or a plurality of further signal line(s) 8 that is/are connected with the signal line(s) 7, to one or a plurality of the above-mentioned connections, in particular flip pads, provided at the upper side of the semiconductor device 2a, and thus to the further semiconductor device 2b.

As results from FIG. 2, the further semiconductor device 2b is furthermore connected, via one or a plurality of further ones of the above-mentioned connections provided at the upper side of the semiconductor device 2a, in particular flip pads, to one or a plurality of further signal line(s) 9 provided in the semiconductor device 2a, which—as will be explained in more detail in the following in FIG. 4—is/are connected with one or a plurality of additional pad(s) 3' provided at the semiconductor device 2a.

The additional pad(s) 3' may—as will be explained in more detail in the following —be manufactured exactly above the pad(s) 3 and be electrically isolated therefrom, so that the additional pad(s) 3' are indeed—as explained above—connected, via the above-mentioned signal line(s) 9, with the further semiconductor device 2b, not, however, with the circuit block(s) 4 provided in the semiconductor device 2a.

After the mounting of the further semiconductor device 2b at the semiconductor device 2a, the two semiconductor devices 2a, 2b can jointly be incorporated in a corresponding package, e.g., in a plug or surface-mountable package, e.g., a BGA (Ball Grid Array) package, etc.

The additional pad(s) 3' provided at the semiconductor device 2a may, by using bonding wires, be connected with one or a plurality of corresponding connections (pins) provided at the semiconductor package (in particular with corresponding pins as—in the (first) state of the device 1 illustrated in FIG. 1)—the pads 3 illustrated in FIG. 1.

For producing the bonding wire connections between the additional pads 3' and the corresponding pins, a conventional bonding machine may be used, as explained above.

The additional pads 3' or pins may—corresponding to the respectively corresponding pads 3 or pins explained with respect to FIG. 1—each assume corresponding (payload) data, address, and/or control pad or pin functions.

As results from FIG. 2, and as will be explained in more detail in the following, it may, for instance, be achieved by the mounting of the further semiconductor device 2b at the semiconductor device 2a that signals (e.g., corresponding (payload) data, address, and/or control signals) input at the above-mentioned pin(s) are—instead, as in the (first) state of the device system 1 illustrated in FIG. 1, via the pads 3 and the above-mentioned signal lines 6 to the peripheral circuit block (s) 4—transmitted to the further semiconductor device 2b via the additional pad(s) 3' and the above-mentioned further signal line(s) 9, and are processed there correspondingly, and that the processed signals are, via the above-mentioned further signal line(s) 8 provided in the semiconductor device 2a and the above-mentioned signal line(s) 7, transmitted to the further circuit block(s) 5.

In the (second) state of the device system 1 illustrated in FIG. 2, signals ((payload) data, address, and/or control signals) output by the further circuit block(s) 5 may—instead, as in the (first) state of the device system 1 illustrated in FIG. 1, via the above-mentioned signal lines 6 to the circuit block(s) 4 and the pad(s) 3—be transmitted to the further semiconductor device 2b via the above-mentioned signal line(s) 8 that is/are connected with the signal line(s) 7, may be processed there correspondingly, and the processed signals may, via the above-mentioned and/or one or a plurality of further signal line(s) 9 provided in the semiconductor device 2a, be transmitted to the additional pad(s) 3', and from there, via the corresponding bonding wire(s), to the pins connected therewith.

Figure 3:
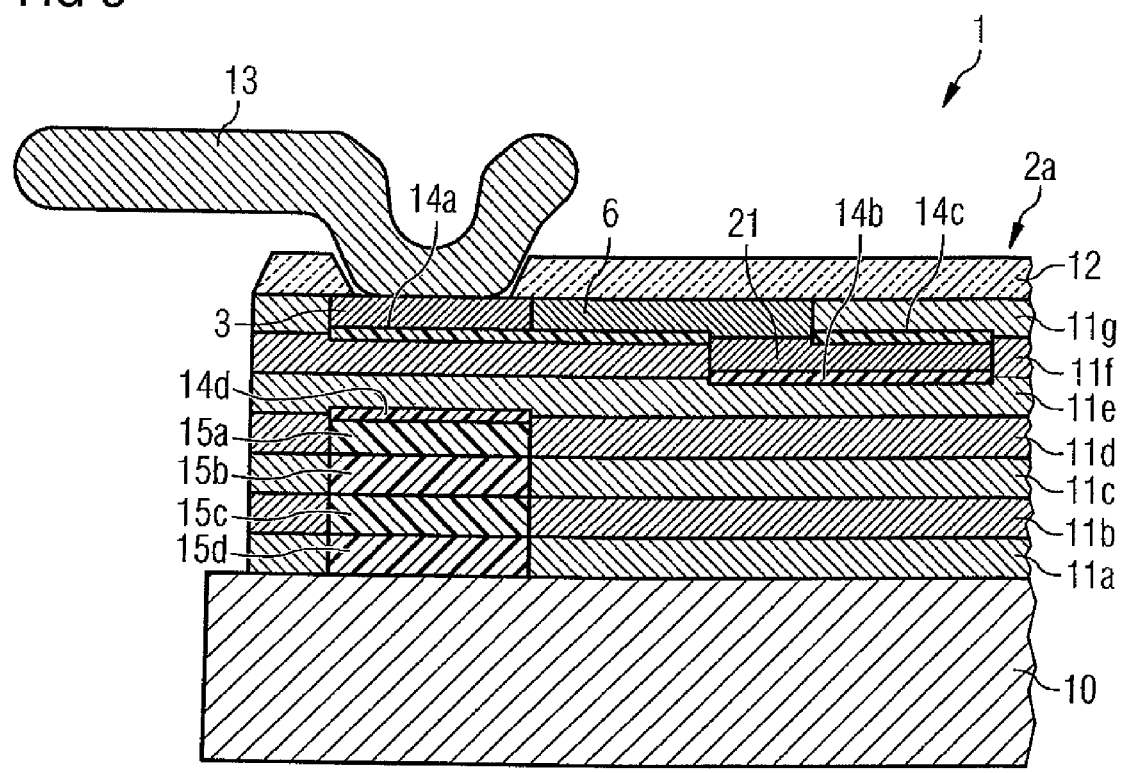
FIG. 3 illustrates a schematic detailed sectional view of a section of the device system in the state illustrated in FIG. 1.

FIG. 3 is a schematic sectional representation of a section of the device system 1—or, more exactly: of the semiconductor device 2a—in the first state illustrated in FIG. 1.

As results from FIG. 3, the semiconductor device 2a includes, in correspondence with conventional semiconductor devices, a plurality of stacked layers 11a, 11b, 11c, 11d, 11e, 11f, 11g, 12 manufactured, for instance, by using appropriate conventional coating and/or exposure and/or etching and/or diffusion and/or implantation process steps on a corresponding silicon base material 10, e.g., a plurality of stacked metallizing layers 11a, 11b, 11c, 11d, 11e, 11f, 11g, and a passivation layer 12 positioned thereabove—i.e. at the upper side of the semiconductor device 2a.

The passivation layer 12 serves to protect the semiconductor device 2a from environmental influences. As passivation layer 12, an appropriate silicon dioxide layer or oxide nitride layer, or any other passivation layer, e.g., a glass passivation layer, may, for instance, be used as it is done conventionally.

In the metallizing layers 11a, 11b, 11c, 11d, 11e, 11f, 11g, the above-mentioned pads 3, the signal lines 6, 7, 8, and the elements of the circuit blocks 4, 5, etc. are formed as it is, for instance, done conventionally.

For the electric isolation of the pads 3, the signal lines 6, 7, 8, the circuit block elements, etc., appropriate isolating layers 14a, 14b, 14c, 14d may—as conventionally—be formed adjacent thereto (e.g., below the pads 3, below and/or above the signal lines 6, 7, 8, etc.).

As results from FIG. 3, appropriate recesses were provided in the passivation layer 12 in regions above the pads 3, so that, by using the above-mentioned bonding machine, the corresponding bonding wires 13 can be connected to the pads 3, and the pads 3 can thus be connected electroconductively with the corresponding pins provided at the device package.

The pad 3 illustrated in FIG. 3 is electroconductively connected with the signal line 6 which is—as was already explained above with respect to FIG. 1—electroconductively connected with the above-mentioned peripheral circuit block 4 (here: via one or a plurality of further signal lines 21).

Furthermore—as results from FIG. 4 (and as already explained above with respect to FIG. 1)—the signal line 7 is electroconductively connected with the signal line 8 (here: via 8). The signal line 8 is electroconductively connected to an additional connecting contact 16 ("docking contact"—which will be explained in more detail in the following—formed in the metallizing layer 11g (i.e. the top metallizing layer of the semiconductor device 2a in the state illustrated in FIG. 3).

The signal line 7 (and thus also the signal line 8 or the above-mentioned additional connecting contact 16) are electroconductively connected with the above-mentioned further circuit block 5 (and the circuit block 4).

For compensating mechanical strains occurring during bonding, appropriate filling material layers 15a, 15b, 15c, 15d may be provided in regions below the pads 3.

If the device system 1 is to provide—instead of the function provided in the first state illustrated in FIG. 3—a new or modified and/or a supplemented function, and/or a function that will be faultless vis-à-vis an initially faulty function, etc., the above-mentioned (micro flip chip) semiconductor device 2b is—prior to the incorporation of the semiconductor device 2a in a corresponding package, or prior to the above-mentioned bonding, respectively—mounted with its functional side upside down on the upper side of the semiconductor device 2a, as is illustrated in FIG. 4.

To this end, as results from FIG. 4—after the removal of the passivation layer 12 illustrated in FIG. 3, or alternatively already prior to the manufacturing of a corresponding passivation layer—, an (additional) isolating layer 14e may be provided above the metallizing layer 11g of the semiconductor device 2a, by which the pad 3, the signal line 6, etc.—not, however, the connecting contact 16 ("docking contact") and one or a plurality of further ("conventional") pads not illustrated in FIG. 4—are electrically isolated toward the top.

To prevent the electric isolation of the connecting contact 16 and of the above-mentioned further pads, the additional isolating layer 14c may, in regions above the connecting contact 16 ("docking contact") and the further pads, be correspondingly removed, and thus the connecting contact 16 and the further pads may be exposed (or, for instance, the connecting contact 16 and the further pads may not be provided with a corresponding isolating layer at all).

Above the additional isolating layer 14c, one or a plurality of further metallizing layers 17a, 17b, here: corresponding redirection layers (RDL), are provided.

In the redirection layers 17a, 17b—as results from FIG. 4—, the above-mentioned additional pad(s) 3', the above-mentioned signal line 9, one or a plurality of further signal lines 18, and the above-mentioned flip pads 19, 20, etc., are formed.

As results from FIG. 4, the above-mentioned additional pad(s) 3' is/are positioned exactly perpendicular above the corresponding pad(s) 3 provided in the metallizing layer 11g, and have substantially the same dimensions as the corresponding pad(s) 3.

Furthermore, electroconductive connecting layers that are electroconductively connected with the above-mentioned further pads toward the bottom and extend to the surface of the top redirection layer 17b are provided in the redirection layers 17a, 17b in regions above the above-mentioned further ("conventional") pads. This was, the further pads are taken to the same level as the additional pad(s) 3'. Thus, it is ensured that the further pads—like in the state of the semiconductor device 2a illustrated in FIG. 3—can be connected with corresponding semiconductor device pins via corresponding bonding wires.

For the electric isolation of the above-mentioned additional pads 3', signal lines 9, 18, flip pads 19, 20, etc., corresponding isolating layers 14f may—as conventionally—be formed adjacent thereto (e.g., below the pads 3', the signal line 9, the flip pad 20, etc.).

A passivation layer 12' by which the semiconductor device 2a is protected from environmental influences is formed above the redirection layers 17a, 17b—i.e. at the upper side of the semiconductor device 2a. As passivation layer, an appropriate silicon dioxide layer or oxide nitride layer, or any other passivation layer, e.g., a glass passivation layer, may be used as it is done conventionally.

As results from FIG. 4 (and as was already explained above with respect to FIG. 1), the additional pad 3' is electroconductively connected with the signal line 9 and the flip pad 20.

Furthermore, the flip pad 19 is electroconductively connected with the further signal line 18, and thus via the above-mentioned additional connecting contact 16 ("docking contact") with the signal line 8, the signal line 7, and the above-mentioned further circuit block 5, and the circuit block 4.

As results from FIG. 4, appropriate recesses were provided in the passivation layer 12' in regions above the additional pad(s) 3' and the above-mentioned further (conventional, not illustrated) pads, so that—after the mounting of the (micro flip chip) semiconductor device 2b at the semiconductor device 2a—the corresponding bonding wires 13' can, by using the above-mentioned bonding machine, be connected to the additional pad(s) 3' and the above-mentioned further—conventional—pads (or, more exactly, the above-mentioned conductive connecting layers in the redirection layers 17a, 17b connected therewith), and the above-mentioned additional pad(s) 3' and the above-mentioned further pads can electroconductively be connected with the corresponding pins provided at the device package.

For the electroconductive connection of the semiconductor device 2b to the semiconductor device 2a, the passivation layer 12' further comprises appropriate recesses also in regions above the flip pads 19, 20

As results from FIG. 4, the (micro flip chip) semiconductor device 2b comprises, in correspondence with the semiconductor device 2a, a plurality of stacked layers 111a, 111b, 111c, 117, 112 manufactured, for instance, by appropriate conventional coating and/or exposure and/or etching and/or diffusion and/or implantation processes on a corresponding silicon base material 110, e.g., a plurality of stacked metallizing layers 111a, 111b, 111c, a redirection layer 117—manufactured as described above with respect to the semiconductor device 2a—, and a passivation layer 112.

In the metallizing layers 111a, 111b, 111c, corresponding signal lines 113, 114 are —e.g., as conventionally—formed, which are, for instance, connected with corresponding elements of a circuit block provided in the (micro flip chip) semiconductor device 2b, which—in the state of the device system 1 illustrated in FIG. 4—is to replace the circuit block 4 of the semiconductor device 2a.

In the redirection layer 117 of the (micro flip chip) semiconductor device 2b, corresponding flip pads 119, 120 are provided, which are electroconductively connected with the signal lines 113 or 114, respectively.

For the electroconductive connection of the semiconductor device 2b to the semiconductor device 2a, the passivation layer 112 comprises appropriate recesses in the region of the flip pads 119, 120.

When connecting the semiconductor device 2b to the semiconductor device 2a, the flip pads 119, 120 provided at the semiconductor device 2b are directly—without bonding wire —, e.g., by using corresponding solder connections 121, 122, connected with the corresponding flip pads 19, 20 provided at the upper side of the semiconductor device 2a, e.g., by using appropriate reflow soldering and/or gluing processes, etc.

Solder may, for instance, be applied on the flip pads 19, 20 and/or 119, 120, and subsequently the semiconductor device 2b (and/or the semiconductor device 2a) may be fixed at the semiconductor device 2a (and/or at the semiconductor device 2b) by using glue, and then the solder may be melted by heating.

By the above-mentioned (micro flip chip) semiconductor device 2b, a corresponding analog transceiver function can, for instance, be provided for the semiconductor device 2a, wherein a digital transceiver function provided by the peripheral circuit block 4 of the semiconductor device 2a is replaced by the analog transceiver function provided by the (micro flip chip) semiconductor device 2b.

Digital signals received from the above-mentioned further circuit block 5 of the semiconductor device 2a may then e.g.,—instead in the form of corresponding digital signals by the circuit block 4—be output at the above-mentioned additional pads 3' by the (micro flip chip) semiconductor device 2b in the form of corresponding analog signals, e.g., analog signals sufficing the USB standard (USB=Universal Serial Bus) (wherein an appropriate digital-analog conversion is performed by the semiconductor device 2b).

Corresponding analog signals, e.g., analog signals sufficing the USB standard (USB=Universal Serial Bus), may be input at the above-mentioned additional pads 3', may be converted to corresponding digital signals by the (micro flip chip) semiconductor device 2b, and may be transmitted to the further circuit block 5.

The input/output of the analog signals by using the (micro flip chip) semiconductor device 2b—in the above-mentioned second state of the device system 1 (cf. FIGS. 2, 4)—may, for instance, be performed by using five additional pads 3' (and the input/output of the digital signals by using the circuit block 4 in the above-mentioned first state of the device system 1 (cf. FIGS. 1, 3) via correspondingly fewer pads 3, e.g., two pads 3, wherein two of the five above-mentioned additional pads 3'—provided in the second state of the device—may be manufactured to be positioned directly above the two pads 3).

Furthermore, a correspondingly modified/improved analog-digital conversion function may, for instance, be provided for the semiconductor device 2a by the above-mentioned (micro flip chip) semiconductor device 2b. An analog-digital conversion function based on a 5V voltage supply and provided by the peripheral circuit block 4 of the semiconductor device 2a may, for instance, be replaced by an analog-digital conversion function based on a 3.3V voltage supply and provided by the (micro flip chip) semiconductor device 2b or vice versa (wherein—in the above-mentioned first state of the device system 1—a corresponding 5V supply voltage may be provided, for instance, at the pad 3 for the peripheral circuit block 4, and—in the above-mentioned second state of the device system 1—e.g., a corresponding 3.3V supply voltage may be provided, for instance, at the (additional) pad 3' for the (micro flip chip) semiconductor device 2b (or vice versa)).

Moreover, it is, for instance, conceivable that, by the above-mentioned (micro flip chip) semiconductor device 2b, a function can be fulfilled for the semiconductor device 2a which is not to be or cannot be fulfilled by the semiconductor device 2a itself—e.g., due to a customer requirement, due to too high development costs or too low quantities, respectively, etc.—, or is not to be or cannot be integrated on the semiconductor device 2a (e.g., since an algorithm that has to be kept secret is concerned, etc.).

Furthermore, a novel function to be integrated on the semiconductor device 2a—or the pertinent design, respectively—can be tested and/or presented to a customer in that a (micro flip chip) semiconductor device 2b based on the new design is first of all mounted on the semiconductor device 2a, and that the resulting overall system is tested and/or presented to the customer, and that the corresponding design is then integrated on the semiconductor device 2a after a successful test.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device system comprising:
   a first semiconductor device comprising a circuit to replace a function provided by a circuit positioned on a further semiconductor device;
   the further semiconductor device comprising:
      a first semiconductor device pad for connecting the first semiconductor device, and
      a further semiconductor device pad,
      wherein the first semiconductor device pad is positioned above the further semiconductor device pad, the first semiconductor device pad and the further semiconductor device pad being electrically isolated from each other by an electrically isolating material layer below the first semiconductor device pad and above the further semiconductor device.

2. The system of claim 1, wherein the first semiconductor device pad and the further semiconductor device pad are positioned perpendicularly on top of each other.

3. The system of claim 1, wherein the first semiconductor device comprises a docking connection, that is connected with the circuit positioned on the first semiconductor device and/or a further circuit positioned on the first semiconductor device, and with the circuit positioned on the further semiconductor device.

4. The system of claim 3, wherein the docking connection is arranged in a top metallizing layer of the first semiconductor device.

5. A semiconductor device system comprising:
   means for providing a first semiconductor device to replace a function provided by a further semiconductor device,
   the further semiconductor device comprising:
      a first semiconductor device pad for connecting the first semiconductor device;
      a further semiconductor device pad below the first semiconductor device pad; and
      an isolating layer between the first semiconductor device pad and the further semiconductor device pad.

6. The system of claim 5, wherein the first semiconductor device pad and the further semiconductor device pad are positioned perpendicularly on top of each other.

7. A semiconductor system comprising:
   a first semiconductor device having a first circuit; and
   a second semiconductor device having a second circuit, positioned on the first semiconductor device and electrically coupled to the first semiconductor device;
   wherein the first semiconductor device comprises:
      a first semiconductor device pad for connecting the second semiconductor device;
      a second semiconductor device pad below the first semiconductor device pad; and
      an isolating layer between the first semiconductor device pad and the second semiconductor device pad,
   wherein a function provided by the first circuit is replaced, modified, and/or supplemented by a function provided by the second circuit positioned on the second semiconductor device.

* * * * *